United States Patent
Kashiwakura

(10) Patent No.: US 8,200,445 B2
(45) Date of Patent: Jun. 12, 2012

(54) POWER SUPPLY NOISE ANALYSIS METHOD, SYSTEM AND PROGRAM FOR ELECTRONIC CIRCUIT BOARD

(75) Inventor: Kazuhiro Kashiwakura, Tokyo (JP)

(73) Assignee: NEC Corporation, Tokyo (JP)

( * ) Notice: Subject to any disclaimer, the term of this patent is extended or adjusted under 35 U.S.C. 154(b) by 348 days.

(21) Appl. No.: 12/401,082

(22) Filed: Mar. 10, 2009

(65) Prior Publication Data

US 2009/0234605 A1 Sep. 17, 2009

(30) Foreign Application Priority Data

Mar. 11, 2008 (JP) ................................ 2008-061589

(51) Int. Cl.
*G01R 25/00* (2006.01)
*G01R 27/00* (2006.01)
*G06F 17/50* (2006.01)

(52) U.S. Cl. .............. 702/65; 702/69; 702/191; 703/14; 716/115

(58) Field of Classification Search .................... 702/65, 702/191; 703/14; 716/115
See application file for complete search history.

(56) References Cited

U.S. PATENT DOCUMENTS

2007/0085193 A1* 4/2007 Kashiwakura ................ 257/698
2008/0002373 A1* 1/2008 Arai et al. ..................... 361/737

FOREIGN PATENT DOCUMENTS

| JP | 2005031850 A | 2/2005 |
| JP | 2005251223 A | 9/2005 |
| JP | 2006266863 A | 10/2006 |
| JP | 2007115772 A | 5/2007 |

OTHER PUBLICATIONS

Hideki et al., JP2005-251223 (machine translation).*
Muneaki, JP2005-031850 (machine translation).*
Japanese Office Action for JP2008-061589 issued Mar. 13, 2012.

* cited by examiner

*Primary Examiner* — Andrew Schechter
*Assistant Examiner* — L. Anderson

(57) ABSTRACT

Disclosed is a method of analyzing power supply noise including: extracting power supply and ground information as well as a capacitor and an LSI chip connected to a power supply and ground from electronic circuit design information; creating an analytical model of power supply noise by connecting respective models of the impedance characteristics of the capacitor and LSI chip to mounting positions of a board model; calculating reflected voltage at the LSI chip based on an impedance characteristic between the power supply of the LSI chip and ground; calculating power supply noise from the LSI chip to the electronic circuit board; based on the reflected voltage at the LSI chip.

4 Claims, 9 Drawing Sheets

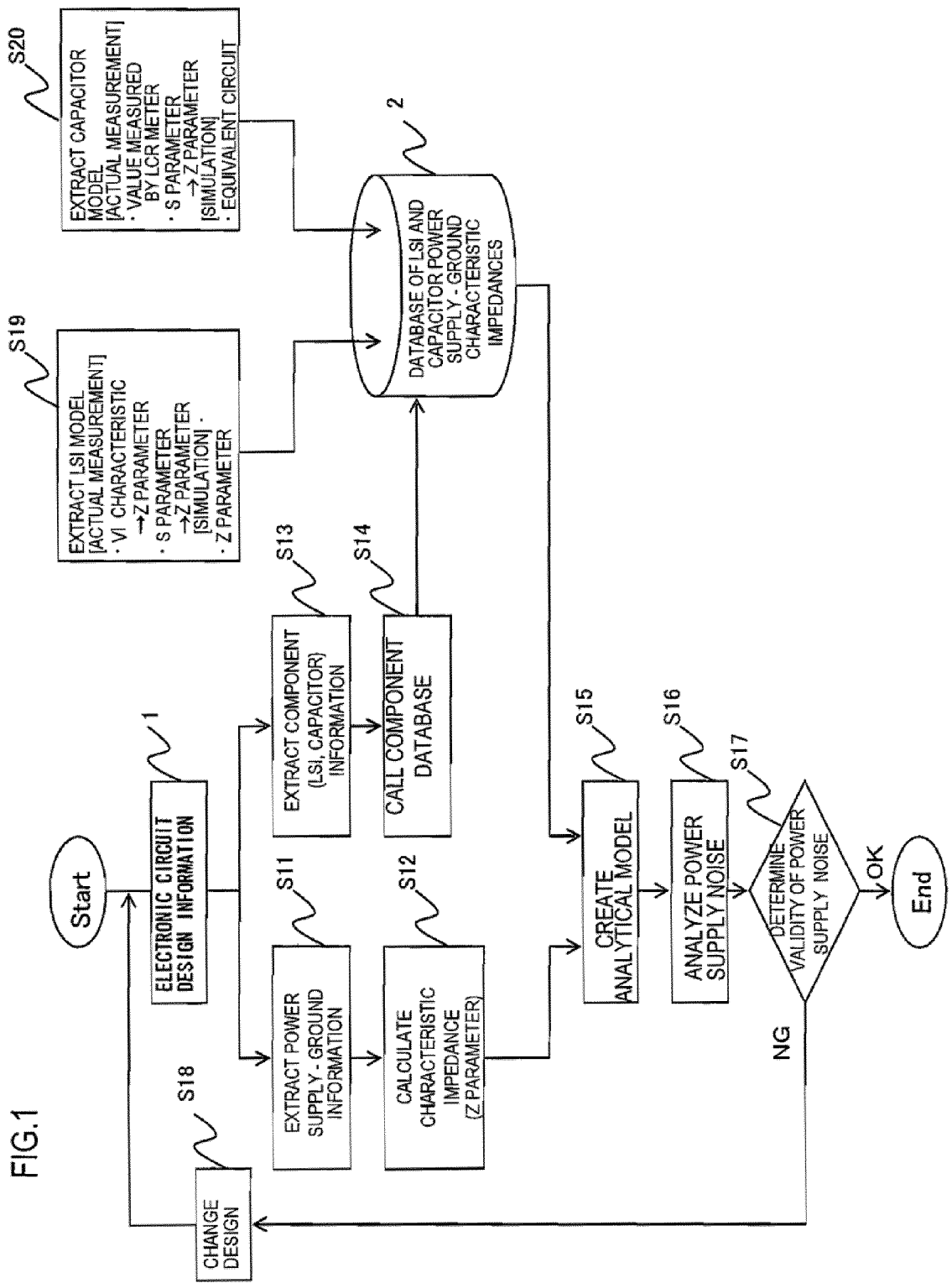

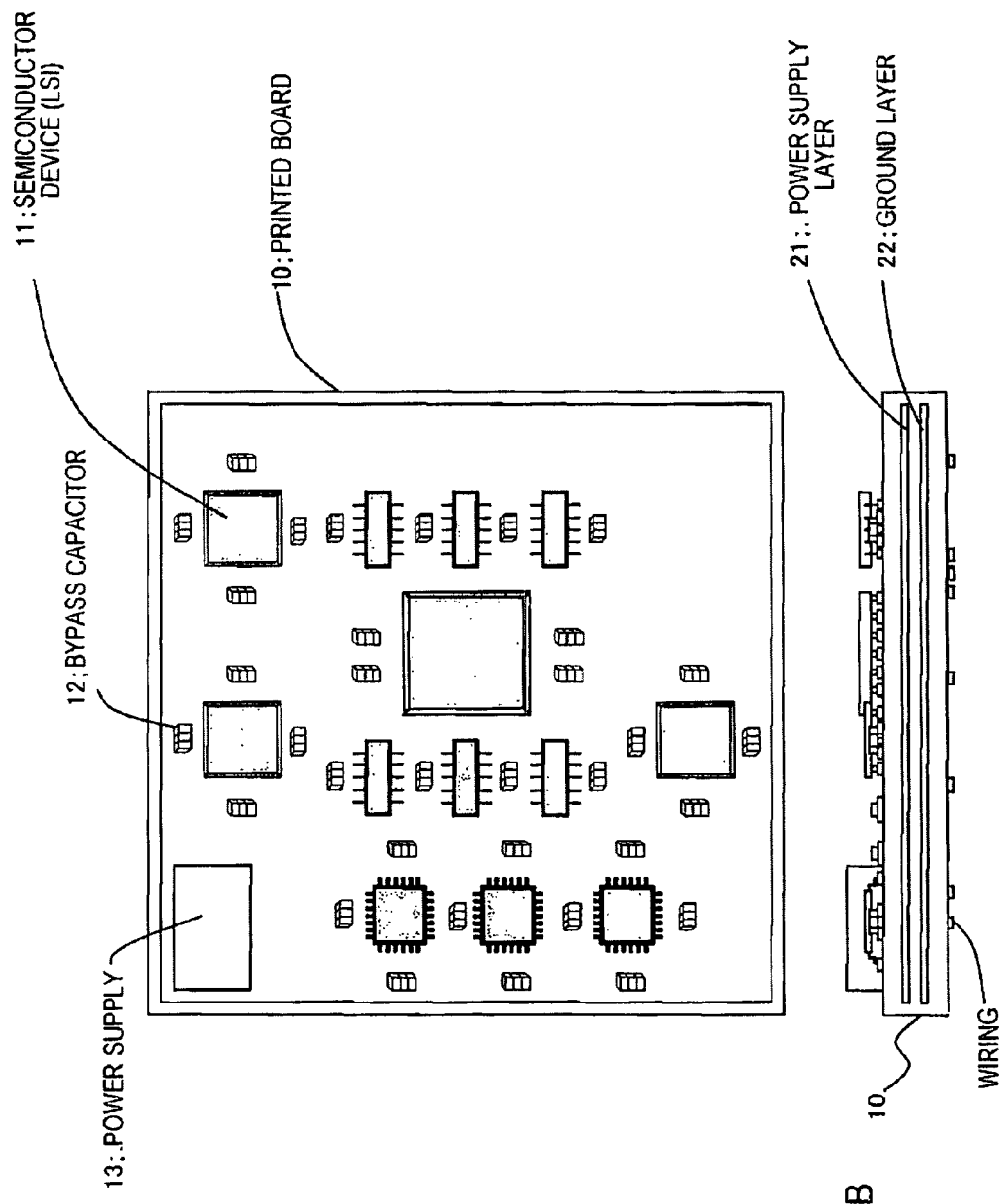
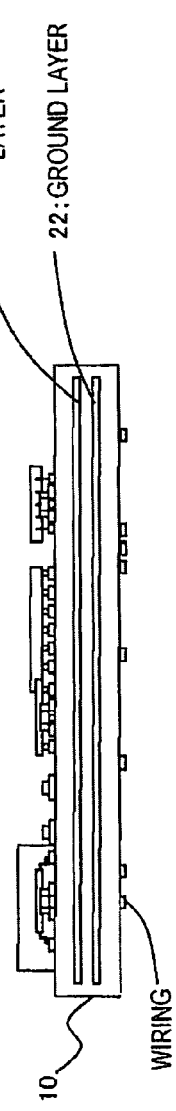
FIG.2A
FIG.2B

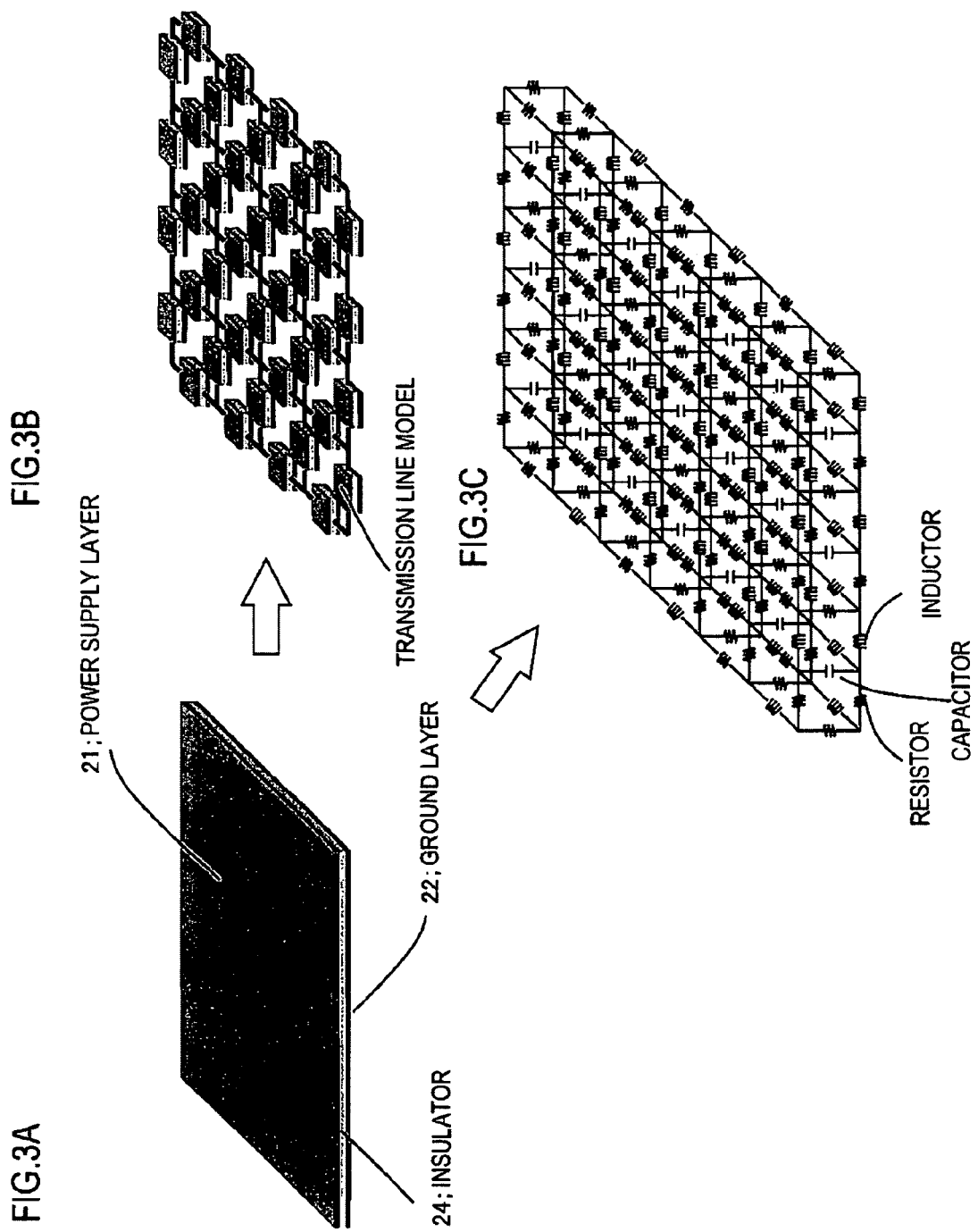

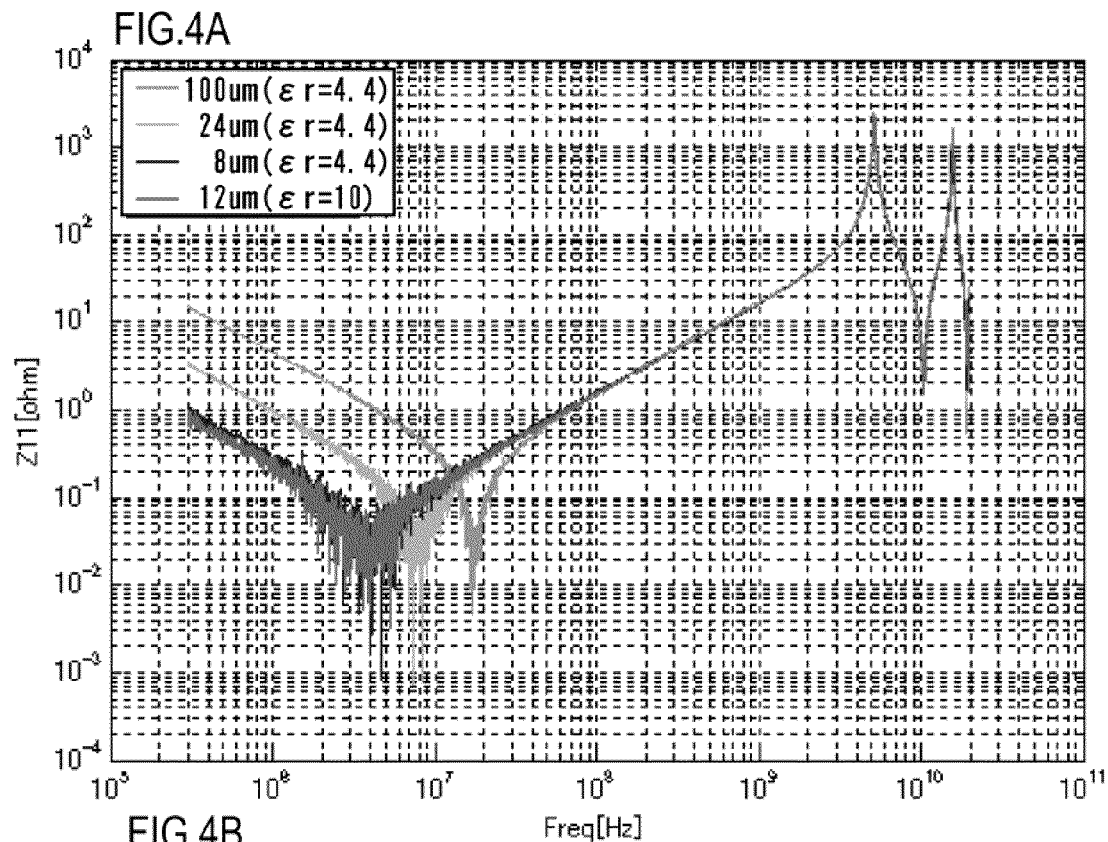
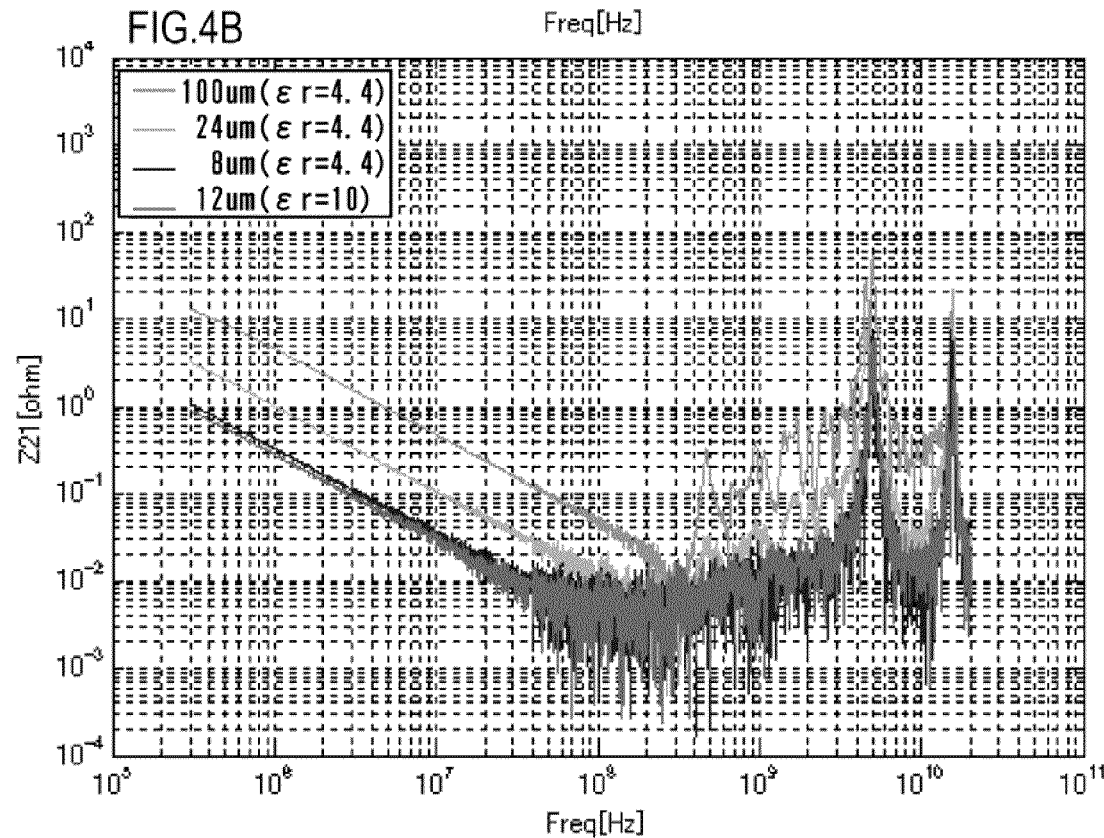

CAPACITOR IMPEDANCE CHARACTERISTIC

CAPACITOR EQUIVALENT CIRCUIT

POWER SUPPLY NOISE ANALYSIS METHOD, SYSTEM AND PROGRAM FOR ELECTRONIC CIRCUIT BOARD

REFERENCE TO RELATED APPLICATION

This application is based on and claims the benefit of the priority of Japanese patent application No. 2008-061589, filed on Mar. 11, 2008, the disclosure of which is incorporated herein in its entirety by reference thereto.

FIELD OF THE INVENTION

This invention relates to a technique for analyzing power supply noise. More particularly, the invention relates to a method, system and program suited to application to analysis of power supply noise in an electronic circuit board.

BACKGROUND ART

Semiconductor electronic components such as chips produced by LSI (Large-Scale Integrated circuit) mounted on electronic circuit boards have undergone advancements in terms of higher signal speed and lower power supply voltage. This means that power supply noise has an influence upon stable operation and quality of the electronic circuit. Specifically, the suppression of power supply noise, referred to as "power integrity (PI)" is essential in the design of an electronic circuit.

In the design phase of an electronic circuit board (referred to also as a "printed board" or "printed circuit board" below), various proposals have been made heretofore with regard to methods of suppressing and analyzing power supply noise. For example, Patent Document 1 discloses a method of evaluating the characteristics of a printed circuit board wherein whether design of a printed circuit board that suppresses variations in power supply voltage and prevents an unwanted electromagnetic emission due to resonance of the power supply circuitry could be achieved is evaluated, during or after creation of a board layout prior to manufacturing of the board. The method includes the steps of:

calculating the impedance characteristic of the power supply circuitry within the board as seen from the power supply-terminal connection position of each active element mounted on the printed circuit board;

calculating the impedance characteristic from the power supply-terminal connection position to a capacitor element connected at a position nearest to this connection position; and determining whether resonance will occur within the power supply circuitry by comparing any among the sizes, phases, real parts or imaginary parts of the impedance characteristic of the power supply circuitry and of the impedance characteristic up to the capacitor element.

This method extracts impedance from power supply-ground design information, calculates resonance of the board and evaluates the validity of the design. However, it does not analyze power supply noise taking the characteristic of a LSI-chip into consideration. That is, the method does not analyze power supply noise that propagates along the printed circuit board from the LSI chip.

Patent Document 2 discloses a power supply noise analysis method as a method that takes into account power supply noise that propagates along a printed circuit board from an LSI chip. This method makes it possible to analyze power supply noise within a semiconductor integrated circuit taking the effect of a printed board into account and to analyze power supply noise on the printed board generated by the semiconductor integrated circuit. This method includes the steps of:

dividing the semiconductor integrated circuit into a plurality of first unit areas;

expressing a power line, circuit and circuit current consumption of each first unit area by a simplified power supply network, capacitance and current source;

obtaining a model of the overall semiconductor integrated circuit by compiling the power supply networks, capacitances and current sources with regard to the plurality of first unit areas; dividing the printed board on which the semiconductor integrated circuit is mounted into a plurality of second unit areas;

expressing the power supply layer of each second unit area by a power supply network and capacitance;

obtaining a model of the overall printed board by compiling the power supply networks regarding the plurality of second unit areas; and solving a circuit equation by combining the model of the overall semiconductor integrated circuit and the model of the overall printed board.

In accordance with this method of analyzing power supply noise, the power supply is analyzed by combining the model for analyzing power supply noise of the semiconductor integrated circuit and the model for analyzing power supply noise of the printed board. As a result, with regard to the semiconductor integrated circuit of interest, the influence of power supply noise generated by another semiconductor integrated circuit on the printed board can be taken into consideration and it is possible to analyze power supply noise that is generated by the semiconductor integrated circuit and propagates along the printed board.

[Patent Document 1] Japanese Patent Kokai Publication No. 2005-251223A

[Patent Document 2] Japanese Patent Kokai Publication No. 2005-31850

The entire disclosures in the above-mentioned Patent Documents and Non-Patent Document are incorporated herein by reference thereto.

The analysis of the related art will be given by the present invention in the below.

The invention disclosed in Patent Document 1 relies solely upon the characteristics of a printed board and bypass capacitor and does not take into account the behavior of the LSI chip that is the source of noise. As a result, even if the amount of noise produced by the LSI chip is small, measures for dealing with the power supply noise are taken as an inevitable consequence and there are instances where this leads to excessive quality, i.e., an increase in cost.

An increase in the speed of a semiconductor device causes an increase in power supply noise, and a reduction in voltage causes a reduction in the immunity to power supply noise. This makes if difficult to design the printed board.

Thus, although it has become essential to suppress power supply noise in a printed board, Patent Document 1 does not clearly set forth a method of precisely analyzing power supply noise.

On the other hand, the invention disclosed in Patent Document 2 makes it possible to take into account the influence of power supply noise generated by another semiconductor integrated circuit on a printed board and to analyze power supply noise that is generated by a semiconductor integrated circuit and propagates along the printed board. However, the invention of Patent Document 2 solves a circuit equation by combining models of the overall semiconductor integrated circuits and the model of the overall printed board. As will be discussed later, the present invention is entirely different.

SUMMARY

Accordingly, an object of the present invention is to provide a method, system and program that make it possible to analyze power supply noise produced in an electronic circuit board by a semiconductor device.

To achieve the foregoing and other objectives and in accordance with the purposes of the present invention, there are provided a method, system, program described below.

In the present invention, there is provided a method of analyzing power supply noise, including:

calculating a reflected voltage of power supply noise at a semiconductor device mounted on an electronic circuit board, based on an impedance characteristic between a power supply and ground of the electronic circuit board and an impedance characteristic between a power supply and ground of a semiconductor device; and analyzing power supply noise of the electronic circuit board, based on the reflected voltage at the semiconductor device.

In accordance with the present invention, there is provided a system including a section that calculates a reflected voltage of power supply noise at a semiconductor device mounted on an electronic circuit board, based on an impedance characteristic between a power supply and ground of the electronic circuit board and an impedance characteristic between a power supply and ground of a semiconductor device and analyzes power supply noise of the electronic circuit board, based on the reflected voltage at the semiconductor device.

In accordance with the present invention, there is provided a program for causing a computer to execute processing comprising:

calculating a reflected voltage of power supply noise at a semiconductor device mounted on an electronic circuit board, based on an impedance characteristic between a power supply and ground of the electronic circuit board and an impedance characteristic between a power supply and ground of a semiconductor device; and analyzing power supply noise of the electronic circuit board, based on the reflected voltage at the semiconductor device.

In the method, system and program according to the present invention, if is arranged so as to obtain power supply noise that flows from the semiconductor device to the electronic circuit board, based on the reflected voltage at the semiconductor device; and, in relation to a plurality of the semiconductor devices mounted on the electronic circuit board, calculate, based on the principle of superposition, the power supply noise of the overall electronic circuit board from the sum of power supply noise that flow from the semiconductor devices to the electronic circuit board.

In the method, system and program according to the present invention, it is arranged so as to compare amount of power supply noise of the semiconductor device and a predetermined amount of immunity to power supply noise, and verify validity of design.

In the method, system and program according to the present invention, use is made of a board model obtained by modeling a power supply layer of the electronic circuit board in the form of a two-dimensional transmission line.

In the method, system and program according to the present invention, it is arranged so as to acquire a model of an impedance characteristic of an electronic component, which is mounted on an electronic circuit board, from a database in which a model of the characteristic of the electronic component is registered, and configure a model for analyzing power supply noise of the electronic circuit board.

In the method, system and program according to the present invention, in relation to power supply noise, use is made of a model that regards power supply noise as being ascribable to switching operation of the semiconductor device.

In the method, system and program according to the present invention, it is arranged so as to extract power supply and ground information as well as electronic components inclusive of at least, a capacitor and the semiconductor device connected to the power supply and ground from design information of the electronic circuit board; configure an analytical model of power supply noise relating to the electronic circuit board by connecting a model of the impedance characteristics of the extracted capacitor and semiconductor device to a mounting position of a board model relating to the electronic circuit board; calculate propagation of power supply noise that flows from the semiconductor device to the electronic circuit board; and analyze behavior of propagation of power supply noise in the electronic circuit board based on power supply noise of each of the plurality of semiconductor devices mounted on the electronic circuit board.

In the method, system and program according to the present invention, it is assumed that n (where n is a prescribed positive integer) of the semiconductor devices are mounted on the electronic circuit board; power supply noise is treated as noise ascribable to switching operation of the semiconductor device; with regard to an ith (where i=1 to n holds) semiconductor device, it is assumed that the following holds: an input impedance characteristic is Zlsi[i]; a reflected impedance characteristic as seen from the position at which the ith semiconductor device is mounted is Z11[i], this characteristic being the result of removing the ith semiconductor device from the overall electronic circuit board; at the mounting position of the ith semiconductor device on the electronic circuit board, power supply voltage VCC is applied as maximum voltage and VCC×Z11[i]/(Z11[i]+Zlsi[i]) is applied as minimum voltage; and noise $$Vamp[i]=VCC-VCC\times Zlsi[i]/(Z11[i]+Zlsi[i])$$

the amplitude of which is the difference between these maximum and minimum voltages flows from the electronic circuit board into the ith semiconductor device; wherein under these conditions, noise Vn[i] that flows from the ith semiconductor device to the electronic circuit board is calculated according to the following from an equation of reflection:

$$Vn[i]=Vamp[i]\times(Zlsi[i]-Z11[i])/(Zlsi[i]+Z11[i])$$

and with regard to the n semiconductor devices, the sum of noise Vn[i] (i=1 to n) that flows from the semiconductor devices to the electronic circuit board is obtained, whereby power supply noise of the overall electronic circuit board is analyzed.

In a method of manufacture according to the present invention, an electronic circuit board is manufactured using the method of analyzing power supply noise of the above-mentioned electronic circuit board in a process for manufacturing the electronic circuit board. In the present invention, there is also provided a computer readable medium storing a program for causing a computer to execute the following processing, comprising:

obtaining a reflected voltage of power supply noise at a semiconductor device which is mounted on the electronic circuit board, based on an impedance characteristic between a power supply and ground of the electronic circuit board and an impedance characteristic between a power supply and ground of the semiconductor device; and analyzing power supply noise of the electronic circuit board, based on the reflected voltage of power supply noise at a semiconductor device.

In accordance with the present invention, modeling a power supply noise generating mechanism makes it possible to analyze power supply noise of an electronic circuit board due to a semiconductor device and to predict the amount of power supply noise at which an electronic circuit can operate stably.

Other features and advantages of the present invention will be apparent from the following description taken in conjunction with the accompanying drawings, in which like reference characters designate the same or similar electronic components throughout the figures thereof.

BRIEF DESCRIPTION OF THE DRAWINGS

FIG. 1 is a diagram useful in describing processing according to an exemplary embodiment of the present invention;

FIGS. 2A and 2B are diagrams useful in describing an example of the configuration of an electronic circuit board (printed board);

FIGS. 3A, 3B and 3C are diagrams useful in describing models of a power supply-ground plane;

FIGS. 4A and 4B are diagrams illustrating power supply-to-ground impedance characteristics;

PREFERRED MODES

Figure 5B:
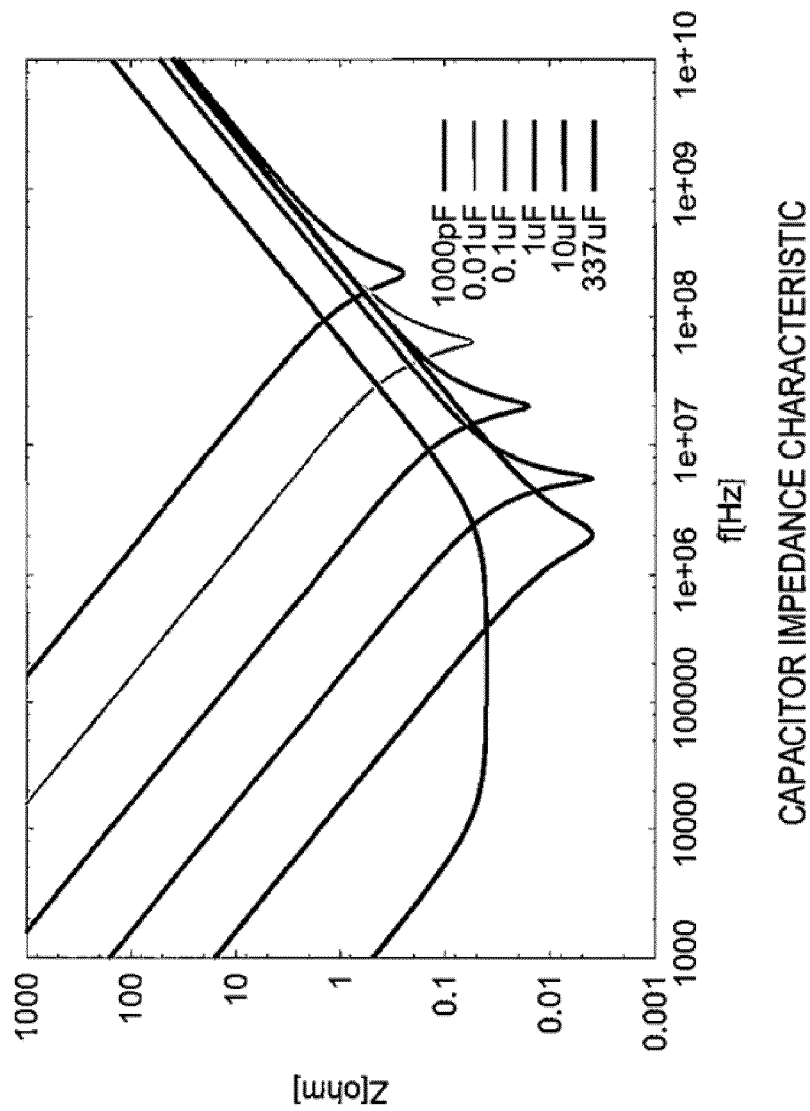
FIGS. 5A and 5B are diagrams illustrating an equivalent circuit and impedance characteristic of a capacitor.

The present invention will be described in further detail with reference to the accompanying drawings. In the present invention, a reflected voltage of power supply noise at the semiconductor device is calculated, based on an impedance characteristic between a power supply of an electronic circuit board and ground and an impedance characteristic between a power supply of a semiconductor device (LSI chip) mounted on the electronic circuit board, and ground, and power supply noise of the electronic circuit board is analyzed based on the reflected voltage at the semiconductor device. In the present invention, power supply noise that flows from the semiconductor device to the electronic circuit board is derived, based on the reflected voltage at the semiconductor device; and the power supply noise of the overall electronic circuit board is obtained by summing amounts of power supply noise that flow from a plurality of the semiconductor devices mounted on the electronic circuit board to the electronic circuit board, based on the principle of superposition.

FIG. 1 is a diagram useful in describing the operating principle (configuration and processing flow) of an exemplary embodiment of the present invention. The system (power supply noise analyzing system) having the configuration shown in FIG. 1 can be implemented by a data processing apparatus having a calculating unit, a storage unit, an input/output, unit and, when necessary, a communication unit, etc. Further, it may be so arranged that all or some of the processing and functions of each of the steps in FIG. 1 is implemented by a program executed by the data processing apparatus. The program may be stored in a computer readable medium.

First, design information relating to power supply and ground is extracted from design information 1 relating to an electronic circuit board, the power supply noise of which is to be analyzed (step S11).

As shown for example in FIG. 2A, the electronic circuit board has a semiconductor device (LSI chip) 11 and electronic components such as a capacitor (bypass capacitor) 12 mounted on a printed board 10. In general, as shown for example in FIG. 2B, a multilayer printed board has a power supply layer (power wiring layer) 21 and a ground layer (ground wiring layer) 22 sandwiching an insulating resin constituting the printed board 10. Power is supplied from a power supply 111 to the LSI chip 11 through these layers. The electronic circuit, design information 1 includes electronic circuit board information, component information relating to the mounted electronic components and connection information, and this information is stored in a prescribed storage unit (storage area).

At step S11 in FIG. 1, physical information and circuit, information connected to the power supply and ground is extracted from the electronic circuit design information 1.

Next, power supply and ground planes in FIG. 3A are approximated (modeled) by a transmission line model as shown in FIG. 3B or by a mesh structure of resistors, capacitors and inductors, etc., as shown in FIG. 3C. FIG. 3C is a diagram illustrating an example in which the two-dimensional transmission line model of FIG. 3B is modeled using inductors (L), capacitors (C) and resistors (R).

Next, at step S12 in FIG. 1, the power supply-to-ground impedance characteristic (Z parameter) is calculated. Examples of impedance calculation are illustrated in FIGS. 4A and 4B. FIG. 4A illustrates reflected impedance (Z11) [ohm] (logarithmic scale) at a certain position, and FIG. 4B illustrates transmitted impedance (Z21) [ohm] (logarithmic scale) from a certain position to a certain position. In FIGS. 4A and 4B, ∈r at "100 μm (∈r=4.4)" represents the relative permittivity (dielectric constant) of the insulator (dielectric) in a parallel-plate capacitor [e.g., a capacitor comprising the parallel plates of the power supply layer 21 and ground layer 22 and an insulator 24 between these plates in FIG. 3A]. The figure of 100 μm is the film thickness of the insulator (dielectric).

At step S13 in FIG. 1, electronic components connected to the power supply and ground are extracted from the electronic circuit design information 1. The electronic components extracted at step S13 are a capacitor used as a bypass capacitor and a semiconductor device (LSI chip).

Figure 5A:
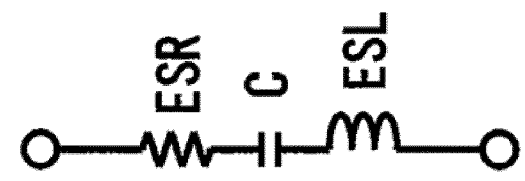

As illustrated in FIG. 5A, the capacitor is not a pure capacitance but is indicated by a series circuit, composed of a capacitor (C), an ESR (Equivalent Series Resistance) and an ESL (Equivalent Series Inductance). The impedance characteristic (logarithmic scale) of the capacitor is illustrated in FIG. 5B. The horizontal axis is a plot of frequency (logarithmic scale). The model of the capacitor may be adapted so as to obtain the impedance characteristic by a method of calculating the power supply-to-ground impedance (Z parameter) from actual measurement (a value measured by an LCR meter) or by measuring an S parameter S11 and converting this to the Z parameter. Alternatively, the impedance characteristic may be found from a simulation. The power supply-to-ground impedance of the capacitor is stored in a component database 2 beforehand as electronic component information (step S20 in FIG. 1).

At step S14 in FIG. 1, with regard to an electronic component, (electronic component information) extracted from the electronic circuit design information 1, the impedance characteristic of the electronic component is read out of the component database 2 and the electronic component is connected to the mounting position on the board model shown in FIGS. 3A to 3C. Further, at step S14, with regard also to the LSI chip, the characteristic (impedance characteristic) similarly is read out of the component database 2 and the LSI chip is connected to the mounting position on the board model shown in FIGS. 3A to 3C.

The model of an LSI chip is such that the impedance characteristic can be obtained by a method of driving the actual device and calculating the power supply-to-ground impedance (Z parameter) from the supply voltage and supply current (VI characteristic), or by measuring a return loss (S parameter S11) and converting this to the Z parameter. Alternatively, if the model is a semiconductor model (SPICE model, etc.), then the impedance characteristic is obtained in similar fashion from a simulation. The impedance characteristic of the LSI also is stored in the component database 2 beforehand (S19 in FIG. 1).

Figure 6A:
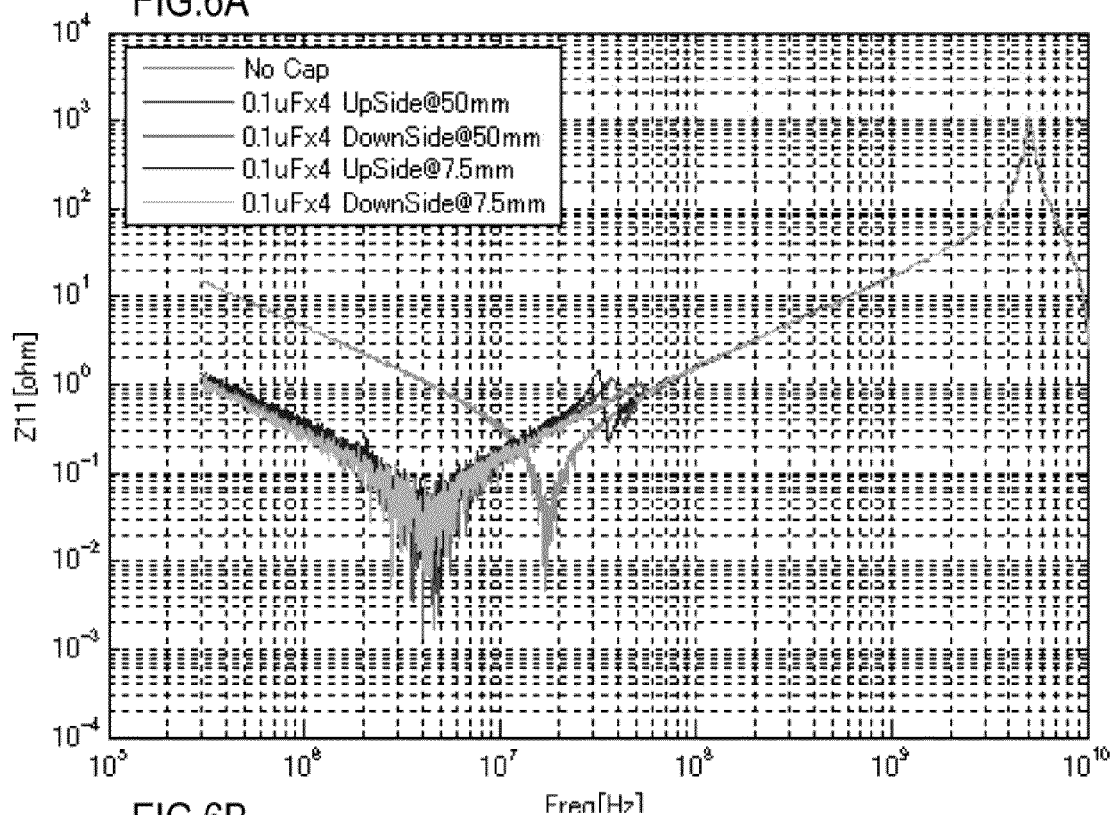
FIGS. 6A and 6B illustrate impedance characteristics obtained by placing a capacitor on an electronic circuit board.
Figure 6B:
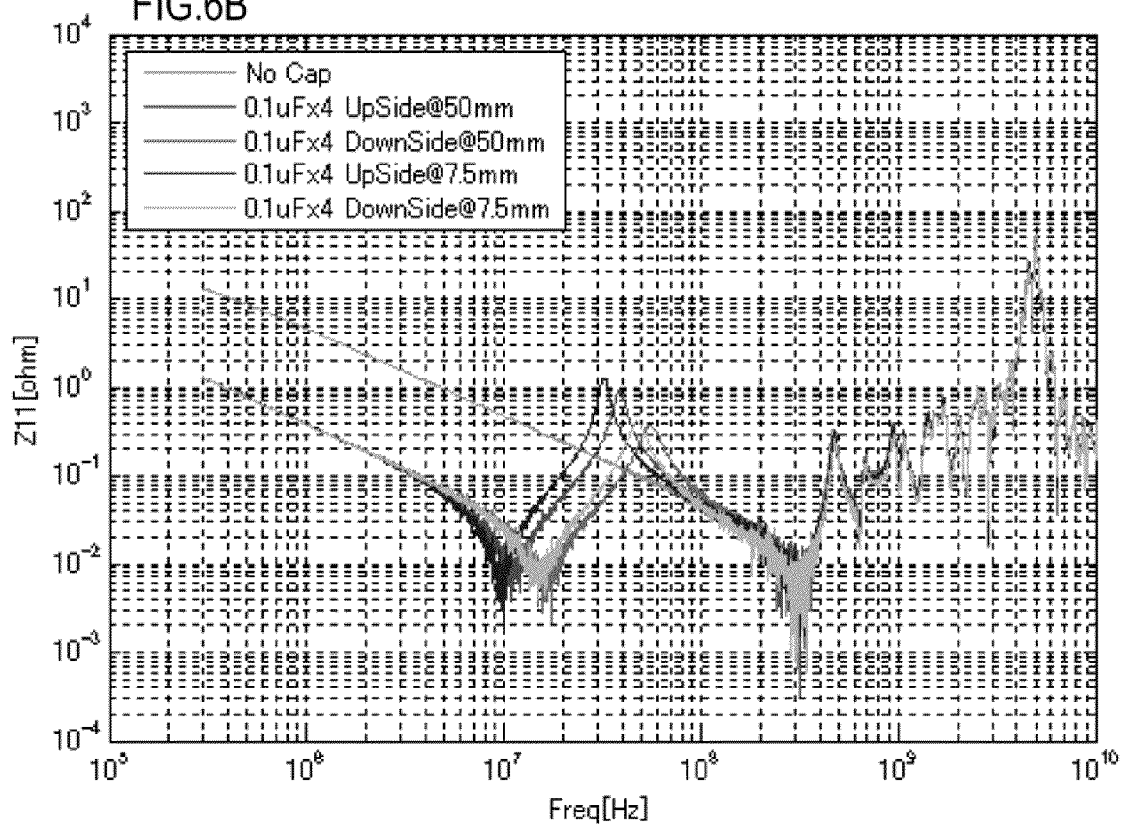

FIGS. 6A and 6B are impedance characteristics obtained by placing a capacitor on an electronic circuit board (printed board), in which FIG. 6A illustrates reflected impedance and FIG. 6B transmitted impedance. These illustrate that mounting a capacitor on a printed board causes a change in the impedance characteristic of the overall board. They illustrate that even if the capacitor has the same capacitance, the characteristic itself changes if the mounting position is changed.

In FIGS. 6A and 6B, "No Cap" represents absence of a capacitor; "0.1 µF×4 UpSide@50 mm" represents a case where four capacitors of capacitance 0.1 µF are laid out spaced away from one another by 50 mm on the component-surface side: and "0.1 µF×4 DownSide@50 mm" represents a case where four capacitors of capacitance 0.1 µF are laid out spaced away from one another by 50 mm on the solder-surface side.

Figure 7:
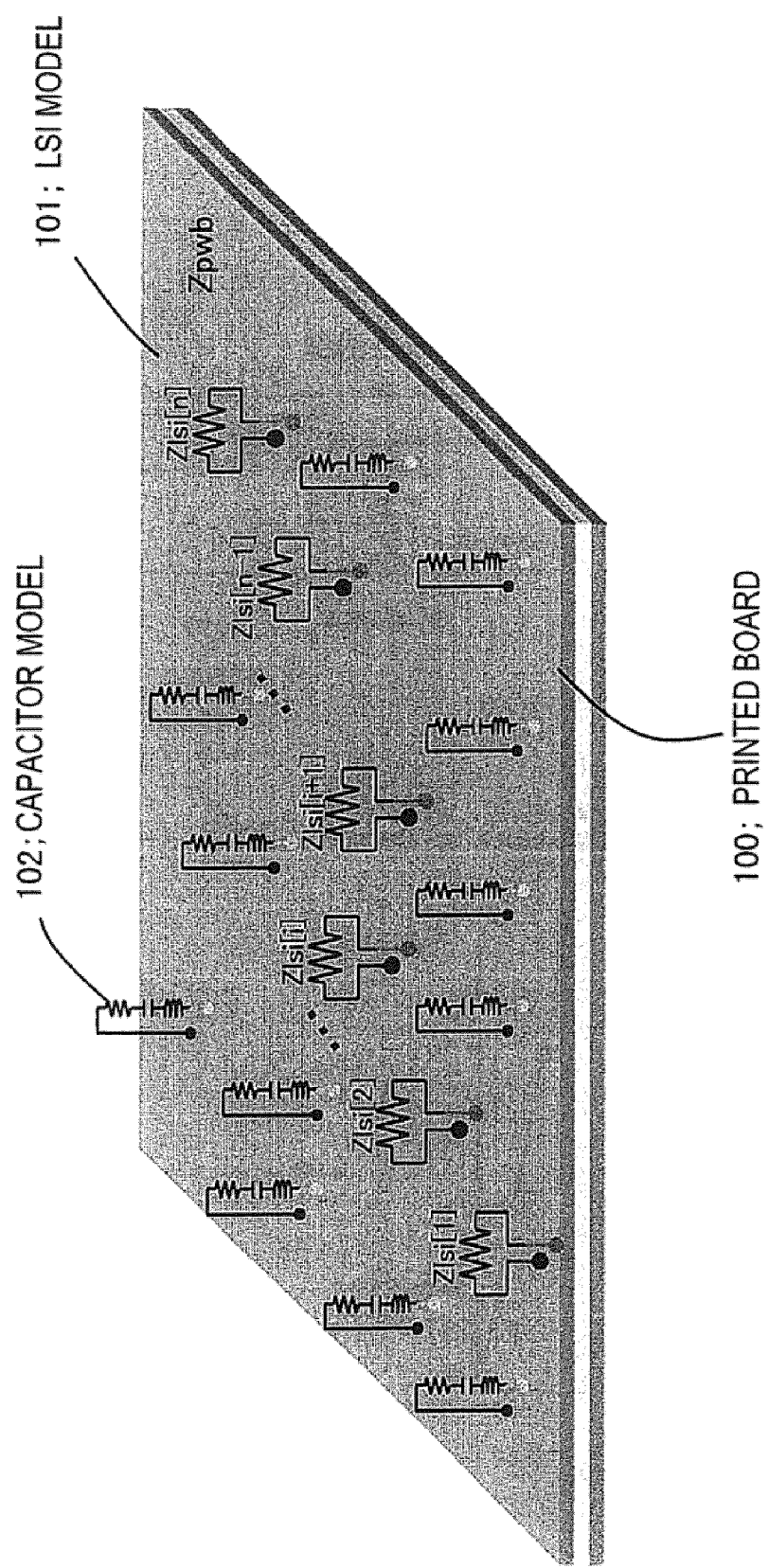
FIG. 7 is a diagram illustrating a model of a printed board.

Next, at step S15 in FIG. 1, a model for analyzing power supply noise is created using the power supply-to-ground impedance characteristic (Z parameter), calculated at step S12 in FIG. 1 and the LSI chip and capacitor impedance characteristics acquired from the differential pair 2. More specifically, as shown for example in FIG. 7, the model for analyzing power supply noise is configured by connecting a capacitor model 102 and an LSI model 101 at respective mounting positions on a board model (model of a printed board) 100.

Next, at step S15 in FIG. 1, power supply noise is analyzed. Analysis of power supply noise will now be described in accordance with a concrete example.

Figure 8:
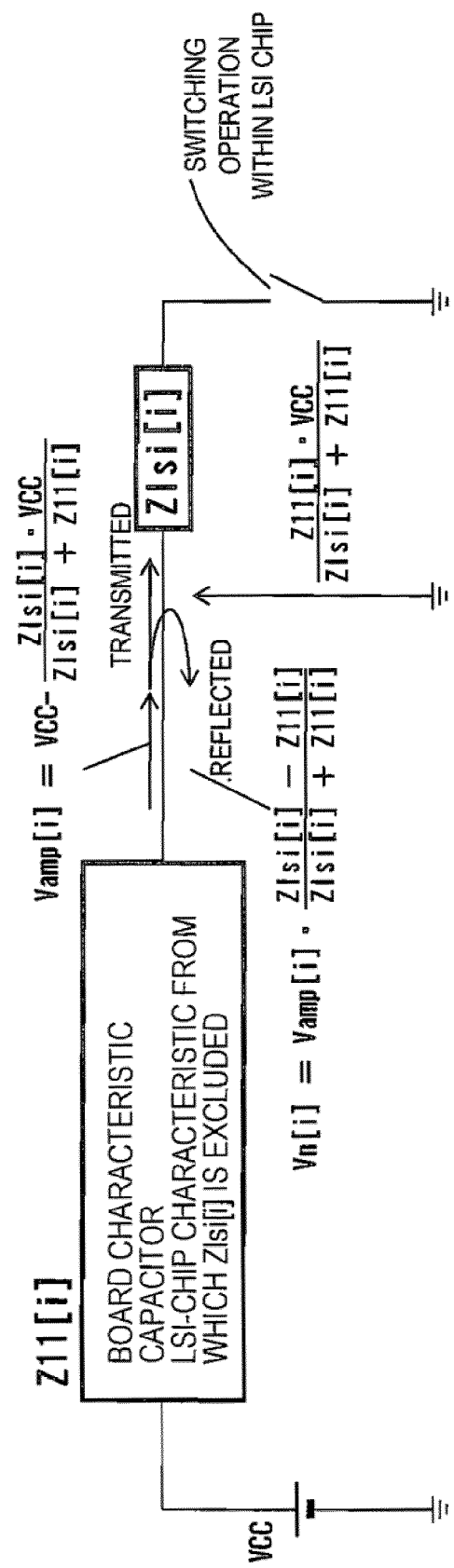
FIG. 8 is a diagram useful in describing analysis of power supply noise in an exemplary embodiment, of the present invention.

FIG. 8 is a diagram useful in describing analysis of power supply noise in an exemplary embodiment of the present invention. As shown in FIG. 8, it is assumed that n-number of LSI chips are mounted on an electronic circuit board. An ith (i=1 to n) LSI chip is taken as an LSI chip of interest.

Let $Zlsi[i]$ represent the characteristic (input impedance) of the ith LSI chip.

A reflected impedance characteristic (Z11) as seen from the position at which the ith LSI chip is mounted is calculated. This characteristic is that obtained by removing the ith LSI chip from the overall board. Let $Z11[i]$ represent this impedance characteristic.

Since power supply noise is ascribable to a switching operation within the LSI chip (e.g., switching operation between logic 0 and 1 in case of a CMOS LSI chip), it can be regarded as the simple model shown in FIG. 8.

Now, at the boundary (mounting position) of the ith LSI chip and electronic circuit board (printed board), power supply voltage VCC and VCC×Z11[i]/(Z11[i]+Zlsi[i]), which is a voltage obtained by dividing the power supply voltage VCC by $Z11[i]$ and $Zlsi[i]$ are applied to the input of the ith LSI chip as maximum and minimum values, respectively, and a noise voltage the amplitude of which is the difference between these maximum and minimum values is applied to the ith LSI chip from the board.

The amplitude of this noise voltage, which is represented by Vamp[i], is given by the difference between the maximum and minimum values and is represented by Equation (1) below.

$$Vamp[i]=VCC-VCC\times Zlsi[i]/(Z11[i]+Zlsi[i]) \quad (1)$$

In general, the impedances $Z11[i]$ and $Zlsi[i]$ are not equal. As a consequence, the effects of reflection and transmission occur.

Specifically, noise Vn[i] that flows from the ith LSI chip to the board is as follows from the equation of reflection:

$$Vn[i]=Vamp[i]\times(Zlsi[i]-Z11[i])/(Zlsi[i]+Z11[i]) \quad (2)$$

This noise Vn[i] spreads throughout the overall board. It should be noted that Vn[i] in Equation (2) generally is expressed by a complex number comprising a real part and an imaginary part.

By calculating the transmitted impedance from the ith LSI chip to any other LSI chip, the propagation of noise Vn[i] that flows from the ith LSI chip to the board can be calculated.

Noise Vn[i] (i=1 to n) is calculated with regard to noise from the first LSI chip to entire n of the LSI chips mounted on the electronic circuit board, and the sum of these individual noise is computed according to the following equation, based on the principle of superposition:

$$\Sigma Vn[i] \quad (3)$$

whereby the behavior of supply noise propagation through the entire electronic circuit board can be analyzed.

Next, the amount of immunity to power supply noise of each LSI chip is defined, the amount of power supply noise of each analyzed LSI chip is compared with the amount of immunity to power supply noise and whether the design is valid or not is checked (step S17 in FIG. 1). If the result, of the comparison is that the amount of power supply noise is unsuitable ("NG" at step S17), then a design change is made in order to reduce the amount of power supply noise (step S18 in FIG. 1).

In general, if the allowable range of the power supply of an LSI chip (the power supply noise margin) is on the order of 5%, application to actual design is fully possible by adopting this margin as the threshold of power supply noise (i.e., as the amount of immunity to power supply noise). By way of example, it may be so arranged that the amount of immunity of an LSI chip to power supply noise is stored in association with the LSI chip in the component database 2 shown in FIG. 1.

Figure 9:
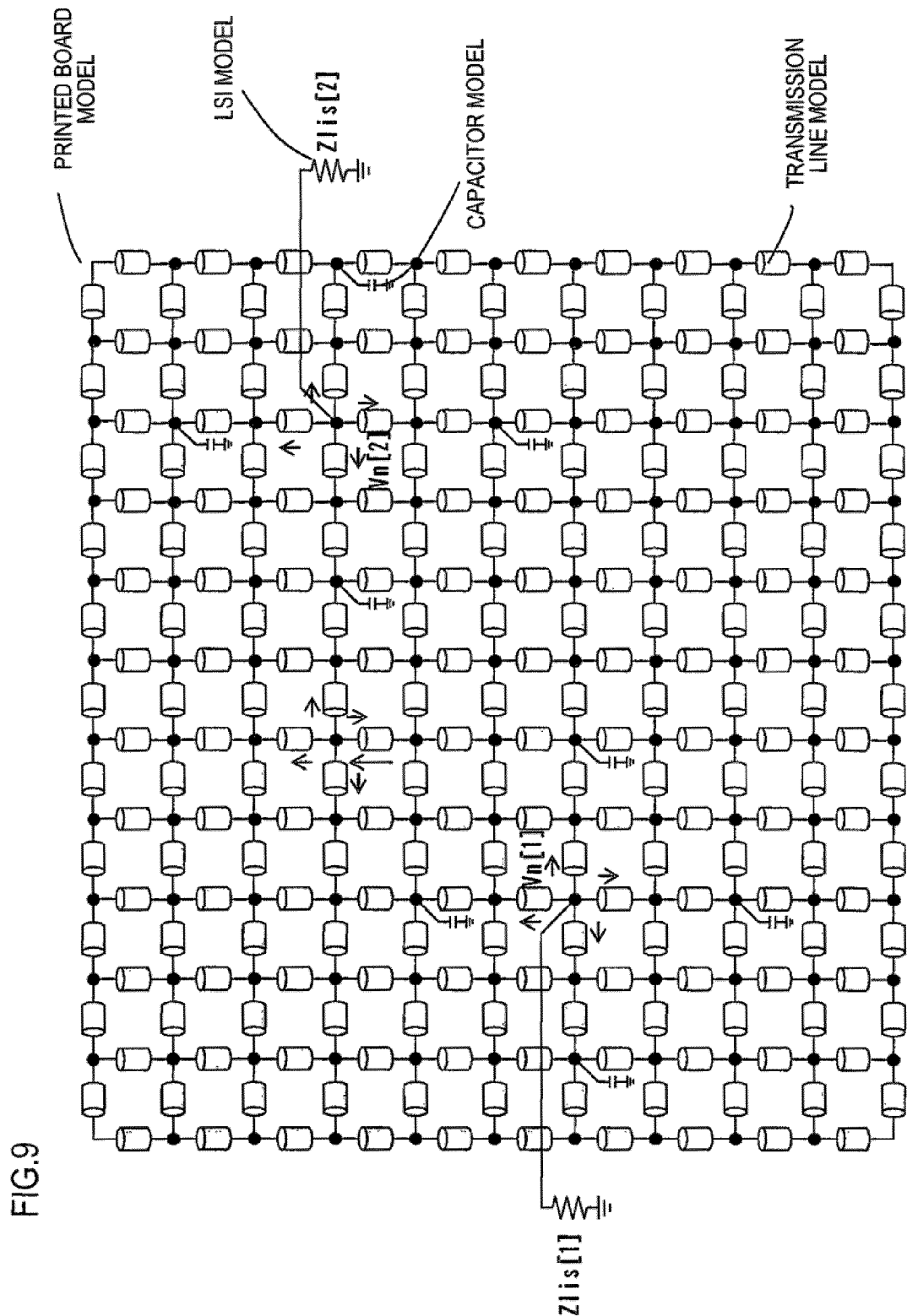
FIG. 9 is a diagram useful in describing a specific example of analysis of power supply noise in an exemplary embodiment of the present invention.

With regard to the analysis of power supply noise at step S16 in FIG. 1, the principle of analysis will be described based on a specific example shown in FIG. 9. FIG. 9 is a model in which two LSI chips and several bypass capacitors are mounted on a printed board. For the sake of convenience, the model of each LSI chip is described as being a pure resistance and the model of each capacitor is described as being a pure capacitance. However, it is assumed that each of these have an impedance characteristic that exhibits a frequency characteristic. Further, an arrangement in which two LSI chips are mounted is adopted in FIG. 9 for the sake of simplicity. In the actual analysis, however, analysis is carried out using characteristic impedance data of the LSI chips and semiconductor electronic components mounted on an electronic circuit board.

A parallel-plate capacitor of power supply and ground is divided into a mesh structure, as illustrated also in FIGS. 3A to 3C. In the example shown in FIG. 9, the arrangement, is such that there is one power supply layer and one ground layer. However, it does not matter if there are a plurality of power supply layers and a plurality of ground layers. In such case it would be required to perform modeling that takes the coupling of these power supply layers and ground layers into consideration.

The models of the LSI chips and capacitors are connected to the mesh-shaped model in conformity with the mounting positions on the electronic circuit board, thereby constructing the analytical model.

Next, a method of analyzing power supply noise using the model shown in FIG. 9 will be described. With regard to a first LSI chip, a reflected wave Vn[1] obtained from FIG. 8 propagates in four directions through the network of transmission lines on the printed board. In the model of FIG. 9, four transmission lines are connected from a single connection point (node) and an amplitude of noise Vn[1]/4 propagates per line.

When noise that propagates through any transmission line meets the next node, reflection and transmission occur.

Since all transmission lines have the same impedance and one transmission line branches into three lines, this is equivalent to the characteristic impedance being connected to one-third of a transmission line.

Thus, we have the following:

$$[\text{amplitude of reflected noise}] = [\text{original amplitude}] \times (Z0/3 - Z0)/(Z0/3 + Z0) \quad (4)$$
$$= [\text{original amplitude}]/2$$

$$[\text{amplitude of transmitted noise per line}] = ([\text{original amplitude}] - [\text{reflected amplitude}])/3 \quad (5)$$
$$= [\text{original amplitude}]/2$$

The more propagation advances, the smaller the amplitude becomes.

Further, whenever a reflected wave meets a node, reflection and transmission are repeated and noise propagates through the entire board in such a manner that the repercussions spread throughout. It should be noted that Equations (4) and (5) are for the case of a model where four transmission lines are connected to one node; the equations will be different depending upon the form of the model.

By repeating these calculations, noise produced by the first LSI chip spread throughout the board and the amounts of noise can be calculated.

Next, calculation is performed similarly with regard to a second LSI chip. If three or more LSI chips are mounted, then the calculations are performed with regard to all of the LSI chips.

Next, the sum of the amounts of noise of all LSI chips is taken. This is equivalent to calculating power supply noise that takes all of the LSI chips into consideration in accordance with the principle of superposition. Thus, the mechanism of supply noise generation can be reproduced and power supply noise can be ascertained at the design stage of the printed board.

Further, with regard to the decision on validity of the model regarding power supply noise at step S17 in FIG. 1, the threshold value of power supply noise is stored in the component database 2 comprising the LSI chip information and reference is had to this value, thereby making a precise decision possible. In addition, feedback to design is facilitated.

For an ordinary LSI chip, the specs of the threshold value of power supply noise are the power supply voltage ±5%. Therefore, by adopting this value as a reference value, a database can be created without difficulty.

In a case where an LSI internally incorporates a PLL (Phase-Locked Loop) and the frequency characteristic of power supply noise is required, this can be registered in a separate database, thereby making possible a further improvement in design quality.

In the present invention, a transmission line model (FIG. 3B) and a mesh-structure model (see FIG. 3C) of resistors, capacitors and inductors are described as models of a power supply-ground plane. However, various modeling methods are applicable, examples of which are a finite element method, boundary element method and FDTD (Finite Difference Time Domain) method. There is no particular limitation upon the power supply-ground modeling technique. It is possible to partition a board into m×n portions horizontally and vertically and describe the board as S parameters of Z parameters having (m×n) ports.

The steps S11 to S20 of FIG. 1 naturally may have their functions implemented by a program executed by a data processing apparatus. In such case the means (program modules) of the data processing apparatus (power supply noise analyzing apparatus) that implements the processing of electronic component information extraction, analytical model creation, power supply noise analysis and determination of power supply noise appropriateness at steps S13, S15, S16 and S17, respectively, of FIG. 1 would constitute information extraction means, analytical model creation means, power supply noise analyzing means and means for determining power supply noise appropriateness, respectively (the same hold true for the other steps).

<Comparison with Related Art>

In Patent Document 2, there is disclosed a method in which a semiconductor integrated circuit and a printed board, which are to undergo analysis of power supply noise, are expressed by a power supply network and a current source network, the model of the overall semiconductor integrated circuit and the model of the overall printed board are combined and a circuit equation is solved. Patent Document 2 does not disclose obtaining the reflected voltage of a semiconductor device and is completely different from the present invention, which is configured to calculate power supply noise that flows from a semiconductor device to an electronic circuit board, based on the reflected voltage of the semiconductor device; and, based on the principle of superposition, analyze the power supply noise of the overall electronic circuit board from the power supply noise that flows to the electronic circuit board.

Though the present invention has been described in accordance with the foregoing embodiments, the invention is not limited to these embodiments and it goes without saying that the invention covers various modifications and changes that would be obvious to those skilled in the art, within the scope of the claims.

What is claimed is:

1. A method of analyzing power supply noise of an electronic circuit board, the method comprising:
    calculating, by a device, a reflected voltage of power supply noise at a semiconductor device mounted on the electronic circuit board, based on an impedance characteristic between a power supply and ground of the electronic circuit board and an impedance characteristic between a power supply and ground of the semiconductor device;

analyzing, by the device, power supply noise of the electronic circuit board, based on the reflected voltage of the power supply noise at the semiconductor device;

extracting power supply and ground information and electronic components inclusive of at least a capacitor and the semiconductor device connected to the power supply and ground from design information of the electronic circuit board;

creating an analytical model of power supply noise by connecting a model of the impedance characteristic of the extracted electronic component to a mounting position on a board model of the electronic circuit board;

calculating propagation of power supply noise flowing from the semiconductor device to the electronic circuit board in the analytical model of power supply noise; and analyzing behavior of propagation of power supply noise in the electronic circuit board, based on each power supply noise of the semiconductor device mounted on the electronic circuit board.

2. The method according to claim 1, wherein n (where n is a prescribed positive integer) of the semiconductor devices are mounted on the electronic circuit board;

power supply noise is treated as noise ascribable to switching operation of the semiconductor device;

relating to an ith (where i=1 to n holds) semiconductor device, it is assumed that the following holds:

an input impedance characteristic is Zlsi[i];

a reflected impedance characteristic as seen from the position at which the ith semiconductor device is mounted is Z11[i], this characteristic being the result of removing the ith semiconductor device from the overall electronic circuit board;

at the mounting position of the ith semiconductor device on the electronic circuit board, power supply voltage VCC is applied as maximum voltage and VCC·×Z11[i]/(Z11[i]+Zlsi[i]) is applied as minimum voltage; and noise $Vamp[i]=VCC-VCC \times Zlsi[i]/(Z11[i]+Zlsi[i])$ the amplitude of which is the difference between these maximum and minimum voltages, flows from the electronic circuit board into the ith semiconductor device;

wherein under the above-described conditions, calculating the noise Vn[i] that flows from the ith semiconductor device to the electronic circuit board according to the following from an equation of reflection:

$Vn[i]=Vamp[i] \times (Zlsi[i]-Z11[i])/(Zlsi[i]+Z11[i])$ and with regard to the n semiconductor devices, obtaining the sum of noise Vn[i] (i=1 to n) that flows from the semiconductor device to the electronic circuit board to analyze power supply noise of the overall electronic circuit board.

3. A system for analyzing power supply noise of an electronic circuit board, the system comprising:

a section that obtains a reflected voltage of power supply noise at a semiconductor device mounted on the electronic circuit board, based on an impedance characteristic between a power supply and ground of the electronic circuit board and an impedance characteristic between a power supply and ground of the semiconductor device;

a section that analyzes power supply noise of the electronic circuit board, based on the reflected voltage of the power supply noise at the semiconductor device;

a section that extracts power supply and ground information and electronic components inclusive of at least a capacitor and the semiconductor device connected to the power supply and ground from design information of the electronic circuit board; and a section that creates an analytical model of power supply noise by connecting a model of the impedance characteristic of the extracted electronic component to a mounting position on a board model relating to the electronic circuit board;

the section that analyzes power supply noise calculating propagation of power supply noise flowing from the semiconductor device to the electronic circuit board in the analytical model of power supply noise, and analyzing behavior of propagation of power supply noise in the electronic circuit board, based on power supply noise of each of a plurality of semiconductor devices mounted on the electronic circuit board.

4. The system according to claim 3, wherein n (where n is a prescribed positive integer) of the semiconductor devices are mounted on the electronic circuit board;

the section that analyzes power supply noise, treats power supply noise as noise ascribable to switching operation of the semiconductor device;

in relation to an ith (where i=1 to n holds) semiconductor device, it is assumed that the following holds:

an input impedance characteristic is Zlsi[i];

a reflected impedance characteristic as seen from the position at which the ith semiconductor device is mounted is Z11[i], this characteristic being the result of removing the ith semiconductor device from the overall electronic circuit board;

at the mounting position of the ith semiconductor device on the electronic circuit board, power supply voltage VCC is applied as maximum voltage and VCC·×Z11[i]/(Z11[i]+Zlsi[i]) is applied as minimum voltage; and noise $Vamp[i]=VCC-VCC \times Zlsi[i]/(Z11[i]+Zlsi[i])$ the amplitude of which is the difference between these maximum and minimum voltages, flows from the electronic circuit board into the ith semiconductor device;

wherein under the above-described conditions, the section that analyses power supply noise, calculates noise Vn[i] that flows from the ith semiconductor device to the electronic circuit board according to the following from an equation of reflection:

$Vn[i]=Vamp[i] \times (Zlsi[i]-Z11[i])/(Zlsi[i]+Z11[i])$ and with regard to the n semiconductor devices, the section that analyses power supply noise, obtains the sum of noise Vn[i] (i=1 to n) that flows from the semiconductor device to the electronic circuit board to analyze power supply noise of the overall electronic circuit board.

* * * * *